US 9,390,932 B2

(12) United States Patent
Romero et al.

(10) Patent No.: US 9,390,932 B2
(45) Date of Patent: *Jul. 12, 2016

(54) ELECTROPOSITIVE METAL CONTAINING LAYERS FOR SEMICONDUCTOR APPLICATIONS

(71) Applicant: INTEL CORPORATION, Santa Clara, CA (US)

(72) Inventors: Patricio E. Romero, Portland, OR (US); Scott B. Clendenning, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/617,937

(22) Filed: Feb. 10, 2015

(65) Prior Publication Data

US 2015/0243508 A1    Aug. 27, 2015

Related U.S. Application Data

(63) Continuation of application No. 13/977,601, filed as application No. PCT/US2011/054051 on Sep. 29, 2011, now Pat. No. 8,952,355.

(51) Int. Cl.
*H01L 29/06* (2006.01)
*H01L 21/285* (2006.01)
(Continued)

(52) U.S. Cl.
CPC .......... *H01L 21/28556* (2013.01); *C23C 16/30* (2013.01); *C23C 16/42* (2013.01); *H01L 21/28506* (2013.01); *H01L 21/28562* (2013.01);
(Continued)

(58) Field of Classification Search
CPC ................... H01L 29/42392; H01L 29/66439
USPC ............................. 257/24, E29.168, E29.245
See application file for complete search history.

(56) References Cited

U.S. PATENT DOCUMENTS

| 6,605,847 B2 | 8/2003 | Kim et al. |
| 7,186,380 B2 | 3/2007 | Chen et al. |

(Continued)

FOREIGN PATENT DOCUMENTS

| CN | 101299440 A | 11/2008 |
| CN | 101388344 A | 3/2009 |

(Continued)

OTHER PUBLICATIONS

Notice of Allowance mailed Jan. 7, 2015, for U.S. Appl No. 13/977,601.

(Continued)

*Primary Examiner* — Chandra Chaudhari
(74) *Attorney, Agent, or Firm* — Green, Howard & Mughal LLP

(57) ABSTRACT

Embodiments of the present invention provide methods for forming layers that comprise electropositive metals through ALD (atomic layer deposition) and or CVD (chemical vapor deposition) processes, layers comprising one or more electropositive metals, and semiconductor devices comprising layers comprising one or more electropositive metals. In embodiments of the invention, the layers are thin or ultrathin (films that are less than 100 Å thick) and or conformal films. Additionally provided are transistor devices, metal interconnects, and computing devices comprising metal layers comprising one or more electropositive metals.

26 Claims, 12 Drawing Sheets

(51) Int. Cl.

| | | |
|---|---|---|
| H01L 29/78 | (2006.01) | |
| H01L 29/786 | (2006.01) | |
| H01L 29/49 | (2006.01) | |
| H01L 29/45 | (2006.01) | |
| H01L 21/768 | (2006.01) | |
| C23C 16/30 | (2006.01) | |
| C23C 16/42 | (2006.01) | |
| H01L 23/522 | (2006.01) | |
| H01L 23/528 | (2006.01) | |
| H01L 23/532 | (2006.01) | |
| H01L 29/04 | (2006.01) | |
| H01L 29/16 | (2006.01) | |
| H01L 29/161 | (2006.01) | |
| H01L 29/201 | (2006.01) | |
| H01L 29/51 | (2006.01) | |
| H01L 29/66 | (2006.01) | |
| H01L 29/775 | (2006.01) | |

(52) U.S. Cl.
CPC .... *H01L 21/28575* (2013.01); *H01L 21/76843* (2013.01); *H01L 21/76849* (2013.01); *H01L 21/76877* (2013.01); *H01L 23/528* (2013.01); *H01L 23/5226* (2013.01); *H01L 23/53266* (2013.01); *H01L 29/04* (2013.01); *H01L 29/0673* (2013.01); *H01L 29/16* (2013.01); *H01L 29/161* (2013.01); *H01L 29/201* (2013.01); *H01L 29/45* (2013.01); *H01L 29/49* (2013.01); *H01L 29/495* (2013.01); *H01L 29/4916* (2013.01); *H01L 29/4966* (2013.01); *H01L 29/4975* (2013.01); *H01L 29/51* (2013.01); *H01L 29/518* (2013.01); *H01L 29/66522* (2013.01); *H01L 29/66568* (2013.01); *H01L 29/78* (2013.01); *H01L 29/785* (2013.01); *H01L 29/78696* (2013.01); *H01L 29/775* (2013.01)

(56) References Cited

U.S. PATENT DOCUMENTS

| | | | |
|---|---|---|---|
| 7,531,452 B2 | 5/2009 | Clark | |
| 7,727,830 B2 | 6/2010 | Chau | |
| 7,893,492 B2* | 2/2011 | Bedell | B82Y 10/00 257/346 |
| 7,964,490 B2 | 6/2011 | Clendenning | |
| 8,440,556 B2 | 5/2013 | Clendenning | |
| 8,858,707 B2* | 10/2014 | Heitsch | B82Y 30/00 117/75 |
| 9,123,567 B2 | 9/2015 | Radosavljevic | |
| 2004/0023486 A1 | 2/2004 | Lopatin et al. | |
| 2005/0121703 A1 | 6/2005 | Hieda et al. | |
| 2007/0049055 A1 | 3/2007 | Ramaswamy et al. | |
| 2008/0227259 A1 | 9/2008 | Avouris | |
| 2008/0272366 A1 | 11/2008 | Moon et al. | |
| 2009/0121288 A1 | 5/2009 | Patruno | |
| 2010/0062614 A1 | 3/2010 | Ma et al. | |
| 2010/0163970 A1 | 7/2010 | Rakshit et al. | |
| 2011/0169059 A1 | 7/2011 | Clendenning | |
| 2011/0195569 A1 | 8/2011 | Moon | |
| 2012/0070981 A1 | 3/2012 | Blackwell | |
| 2012/0301732 A1 | 11/2012 | Okuno et al. | |
| 2014/0203366 A1 | 7/2014 | Schulz et al. | |

FOREIGN PATENT DOCUMENTS

| | | |
|---|---|---|
| EP | 1142894 | 10/2001 |
| JP | 2002280562 | 9/2002 |
| JP | 2003152077 | 5/2003 |
| JP | 2005510874 A | 4/2005 |
| JP | 2005167132 | 6/2005 |
| JP | 2005167132 A | 6/2005 |
| JP | 2006028572 | 2/2006 |
| KR | 1020080097762 | 11/2008 |
| KR | 201166433 | 3/2011 |
| WO | 2004010469 | 1/2004 |
| WO | 2011102396 A1 | 8/2011 |
| WO | 2013048417 | 4/2013 |

OTHER PUBLICATIONS

Dieter, "First Successful Reaction of a Silyl Anion with Hafnium Tetrachloride", Chem. Communications, 2002, 1190-1191.

Viljami Pore et al, "Atomic Layer Deposition of Anitmony and its Compounds Using Dechlorosilylation Reactions of Tris (triethylsily)antimony", Chemistry of Materials, 2011, 547-254.

European Search Report mailed Jun. 19, 2015 for EP Patent Application No. 11873468.0.

Japanese Office Action mailed Jun. 16, 2015 for Patent Application No. 2014-533260.

Korean Notice of Preliminary Rejection mailed Jun. 17, 2015 for KR Patent Application No. 10-2014-7008071.

International Preliminary Report on Patentability mailed Apr. 10, 2014 for PCT Application No. PCT/US2011/05405.

International Search Report and Written Opinion mailed May 8, 2012 for PCT Application No. PCT/US2011/05405.

Taiwan Notice of Allowance mailed Sep. 23, 2015 for TW Patent Application No. 101132364—no translation available.

Taiwan Office Action and Search Report mailed Mar. 2, 2015 for TW Patent Application No. 101132364.

Office Action for Chinese Patent Application No. 2011800738458, issued on Dec. 31, 2015. No English translation available.

Office Action for Japanese Patent Application No. 2014-533260, issued on Mar. 8, 2016.

* cited by examiner

Ar = 3,5-CF$_3$C$_6$H$_4$-

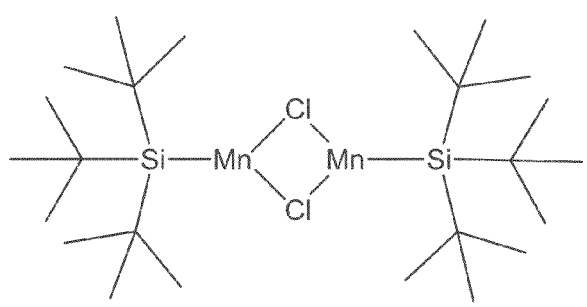
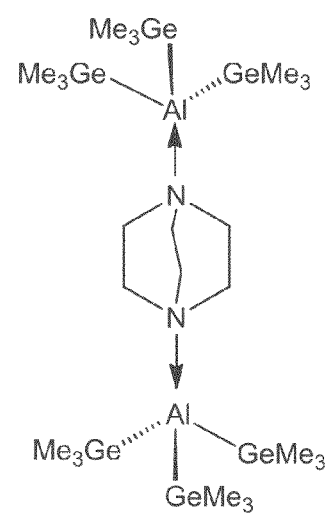
FIGURE 3H                    FIGURE 3I

ELECTROPOSITIVE METAL CONTAINING LAYERS FOR SEMICONDUCTOR APPLICATIONS

BACKGROUND OF THE INVENTION

1. Field of the Invention

The embodiments of the present invention relate generally to integrated circuit devices, semiconductor devices, metal interconnects, transistors, conformal films, atomic layer deposition processes, chemical vapor deposition processes, and chemical, deposition processes.

2. Background Information

The push toward ever-smaller more highly integrated circuit (IC) and other semiconductor devices places enormous demands on the techniques and materials used to construct the devices. In general, an integrated circuit chip is also known as a microchip, a silicon chip, or a chip. IC chips are found in a variety of common devices, such as the microprocessors in computers, cars, televisions, CD players, and cellular phones. A plurality of IC chips are typically built on a silicon wafer (a thin silicon disk, having a diameter, for example, of 300 mm) and after processing the wafer is diced apart to create individual chips. A 1 $cm^2$ IC chip having feature sizes around of about 90 nm can comprise hundreds of millions of components. Current technologies are pushing feature sizes even smaller than 45 nm. Components of IC chips include, for example, transistors such as CMOS (complementary metal-oxide-semiconductor) devices, capacitive structures, resistive structures, and metal lines that provide electronic connections between components and external devices. Other semiconductor devices include, for example, various diodes, lasers, photodetectors, and magnetic field sensors.

BRIEF DESCRIPTION OF THE FIGURES

FIGS. 3A-I illustrate further exemplary precursor molecules that are useful in embodiments of the invention.

DETAILED DESCRIPTION OF THE INVENTION

The deposition of electropositive metal and highly electropositive metals can present challenges for the manufacture of semiconductor devices comprising these metallic elements due to a combination of unfavorable factors. The unfavorable factors include the very high energies needed to reduce the electropositive metals and the high affinity of most electropositive metals for carbon, nitrogen, and oxygen. The deposition of electropositive metals using CVD (chemical vapor deposition) or ALD (atomic layer deposition) processes can lead to the deposition of undesirable non-stoichiometric binary and ternary phases such as metal-oxides, -nitrides, -carbides, or a combination of these species. Carbon, nitrogen, and or oxygen, are often undesirable components that can degrade the performance of a desired film comprised of one or more electropositive metals.

Embodiments of the present invention provide methods for forming layers that comprise electropositive metals using ALD and or CVD processes, layers comprising one or more electropositive metals, and semiconductor devices comprising layers comprising one or more electropositive metals. In embodiments of the invention, the films are thin or ultrathin (films that are less than 100 Å thick) and or conformal films. Advantageously, films according to embodiments of the invention do not include significant amounts of carbon, nitrogen, and oxygen. In an embodiment of the invention films comprising electropositive metals comprise a total amount of carbon, nitrogen, and oxygen impurities of less than 15 atomic percent.

In general atomic layer deposition (ALD) is a technique used in the semiconductor processing industry typically to deposit ultrathin conformal films. In a typical ALD process, a substrate surface to be coated with a film is exposed to gas phase reactants (precursors) sequentially. Repeated exposure of the surface to the reactants sequentially creates a thin conformal product layer on the surface. Reactant gases and reaction byproducts are purged from the reaction chamber after the surface is exposed to each gas phase reactant.

In general chemical vapor deposition (CVD) is a process used to create film layers on a substrate surface. In a CVD process, a substrate surface is exposed to volatile reactant precursors which undergo reactions on the substrate surface forming a desired film material. ALD and CVD can be used to deposit materials in a variety of forms, including for example, monocrystalline, noncrystalline, amorphous, and epitaxial films. CVD and ALD processes are typically performed in a vacuum chamber that is part of a specialized device.

Figure 1A:
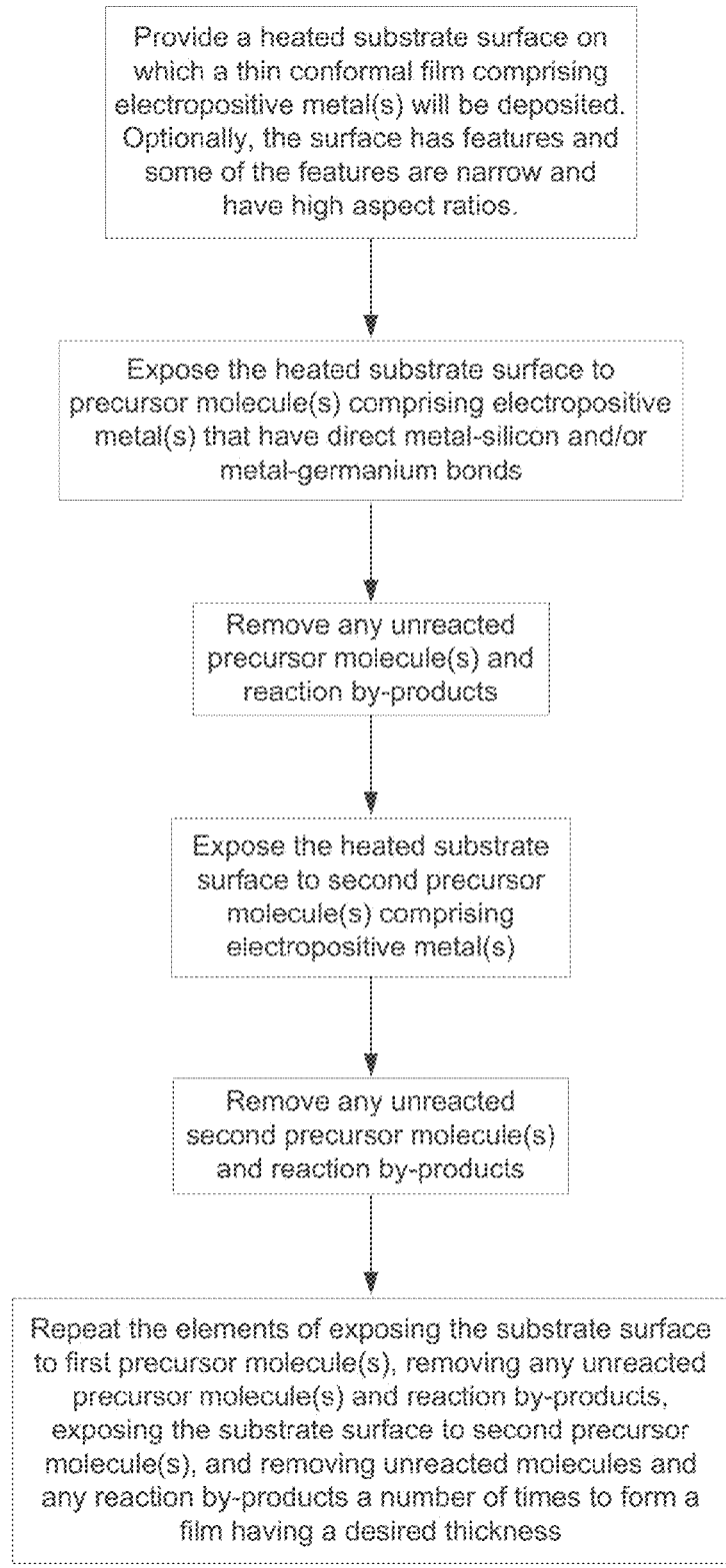
FIGS. 1A-B diagram methods useful for forming a thin conformal film comprising an electropositive metal on a substrate surface.

FIG. 1A describes ALD methods for forming a layer comprising one or more electropositive metals on a substrate. Film deposition processes according to embodiments of the invention are capable of depositing thin conformal films on substrates having micrometer and nanometer scale features and micrometer and nanometer scale features having high aspect ratios. In FIG. 1A, a substrate surface on which a thin conformal film will be deposited is optionally heated during the film deposition process. In embodiments of the invention, the substrate is heated to at least above room temperatures during deposition. Even if minimal thermal energy is required for the deposition, heating can allow the maintenance of consistent, deposition conditions. The film deposition process can occur at relatively low temperatures, for example, deposition can occur at temperatures between 30 and 500° C.

The substrate surface is exposed to first precursor molecules comprising an electropositive metal. In embodiments of the invention, the electropositive metal is a metal selected from groups 2-7 of the periodic table of the elements and or Al. In an embodiment of the invention, electropositive metals are metals such as, Zr, Be, Mg, Ca, Sr, Al, Sc, Y, Ti, Hf, V, Nb, Ta, Cr, Mo, W, and Mn. The first precursor molecules comprise direct metal-silicon and or metal-germanium bonds. In embodiments of the invention, the first precursor molecules comprise from 1 or 2 metal atoms and the metal atoms are all the same metal atom or two different metal atoms. The metal center(s) of the first precursor molecules that comprise direct metal-silicon and or metal-germanium bonds can optionally have a coordinated Lewis base ligated through an N, P, O, or S atom. Any precursor molecules that are not on the surface (and any other gaseous species that maybe present) are removed, by, for example, purging the vacuum chamber in which the deposition is occurring with an inert gas, such as nitrogen, helium, neon, argon, krypton, or xenon. The substrate surface is then exposed to the second precursor molecule (the co-reactant). The second precursor molecule is a volatile $MX_n$ compound where X is a halogen or an oxygen-containing ligand and n is a number between and including 2 and 6. A reaction scheme for depositing a film using an electropositive metal comprising direct metal-silicon and or metal-germanium bonds is shown in equation (1).

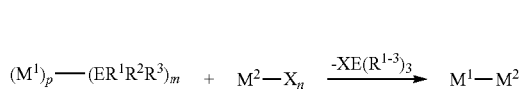

(1)

In equation (1) m and n are a number between and including 2 and 6, $R^1$, $R^2$, and $R^3$ are the same or different and are hydrocarbon groups or hydrocarbon groups comprising one or more heteroatoms, such as a halogen, O, N, S, P, Si, and or Ge, X is a halogen or an alkoxide (—OR, where R is a hydrocarbon or a heteroatom containing hydrocarbon, such as, an alkyl or heteroatom containing alkyl group), E is silicon and or germanium, $M^1$ and $M^2$ are electropositive metals selected from groups 2-7 of the periodic table of the elements and or Al, and p is 1 or 2, and when p is 2 the electropositive metals that comprise the molecule $(M^1)_p$-$(ER^1R^2R^3)_m$ can be the same or different. Hydrocarbons include, for example, branched and unbranched alkyl, aryl, cycloalkyl, alkenes, alkynes, cyclic, and polycyclic groups. The metals $M^1$ and $M^2$ can be the same metal or different metals. In an embodiment of the invention $M^1$ and $M^2$ are metals, such as, Zr, Be, Mg, Ca, Sr, Al, Sc, Y, Ti, Hf, V, Nb, Ta, Cr, Mo, W, and Mn. Useful halogens include fluorine, chlorine, bromine, and iodine. The formation of metal-metal bonds in the growing film and the formation of the volatile product $(R^{1-3})_3EX$ are factors that drive the reaction forward. It is also possible to supply the reactant and or the co-reactant to the chamber as a mixture of the gaseous reactant with an inert gas, such as, for example, as nitrogen, helium, neon, argon, krypton, or xenon.

Any remaining gaseous co-reactant and gaseous reaction products are then removed from the chamber, by, for example, purging the chamber with an inert, gas such as, argon or nitrogen. The elements of exposing the substrate surface to a first reactant, removing any remaining gaseous reactant that is not adhered to the substrate surface, exposing the substrate to a co-reactant, and removing any gaseous co-reactant (and gaseous reaction products) from the chamber are repeated a plurality of times. These elements are repeated a number of times that is determined by the desired thickness of the resulting layer of electropositive metal(s) on the surface of the substrate. The elements could be performed just one time or a plurality of times.

Figure 1B:
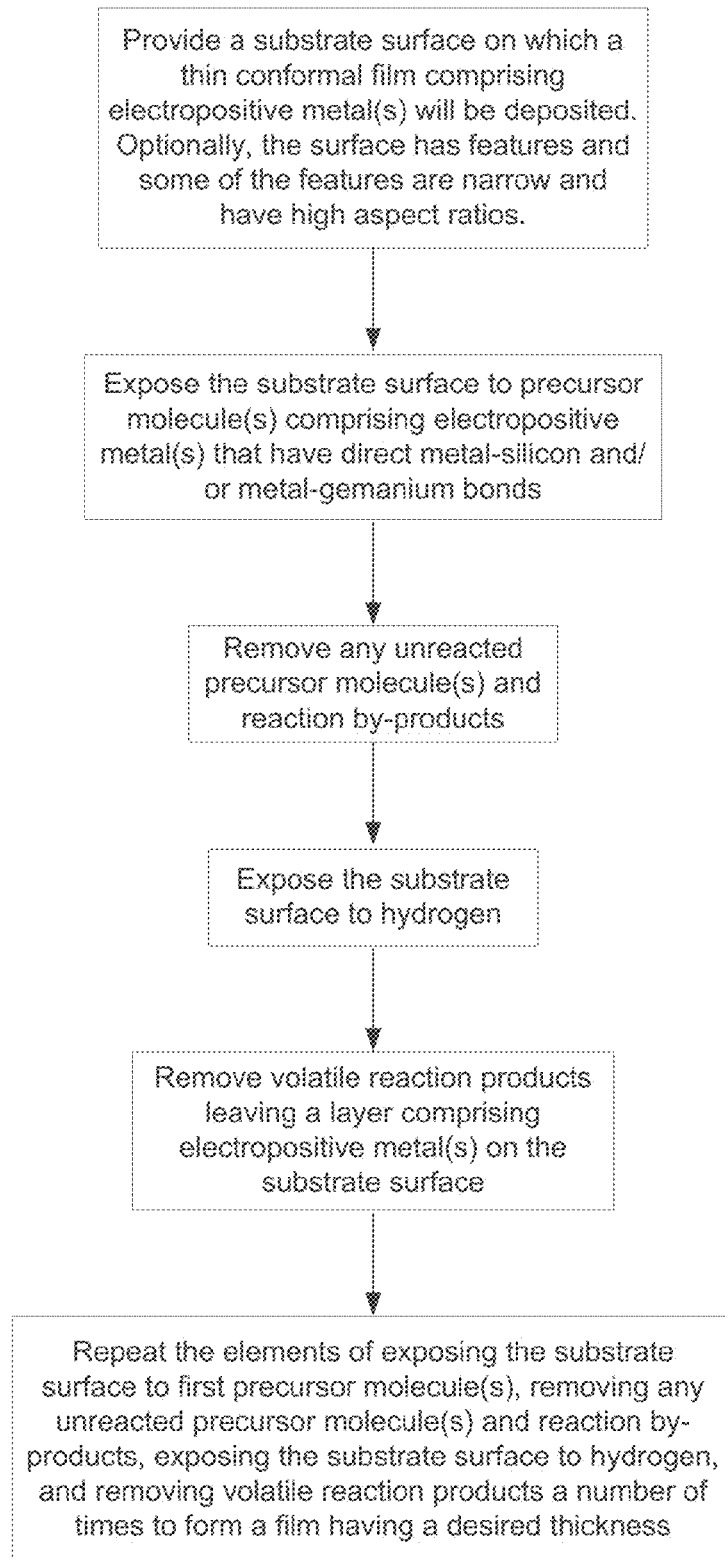

FIG. 1B describes additional methods for forming a layer comprising electropositive metal(s) on a substrate. Film deposition processes according to embodiments of the invention are capable of depositing thin conformal films on substrates having micrometer and nanometer scale features and micrometer and nanometer scale features having high aspect ratios. In FIG. 1B, a substrate surface on which a thin conformal film will be deposited is optionally heated during the film deposition process. In embodiments of the invention, the substrate is heated to at least above room temperatures during deposition. Even if minimal thermal energy is required for the deposition, heating can allow the maintenance of consistent deposition conditions. The film deposition process can occur at relatively low temperatures, for example, deposition can occur at temperatures between 30 and 500° C.

The substrate surface is exposed to first precursor molecules comprising an electropositive metal. In embodiments of the invention, the electropositive metal is a metal selected from groups 2-7 of the periodic table of the elements and or Al. In an embodiment of the invention, electropositive metal is a metal such as, Zr, Be, Mg, Ca, Sr, Al, Sc, Y, Ti, Hf, V, Nb, Ta, Cr, Mo, W, and Mn. The first precursor molecules comprise direct metal-silicon and or metal-germanium bonds. In embodiments of the invention, the first precursor molecules comprise from 1 to 2 metal atoms and the metal atoms are all the same metal atom or a mixture of different metal atoms. The metal center(s) of the first precursor molecules that comprise direct metal-silicon and or metal-germanium bonds can optionally have a coordinated Lewis base ligated through an N, P, O, or S atom. Any remaining gaseous precursor molecules (and any other gaseous species that maybe present) are removed, by, for example, purging the vacuum chamber in which the deposition is occurring with an inert gas. The substrate surface is then exposed to the second precursor molecule (the co-reactant). The second reactant is hydrogen. A reaction scheme for depositing a film using an electropositive metal comprising direct metal-silicon and or direct metal-germanium bonds is shown in equation (2).

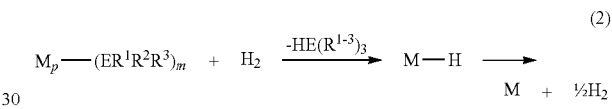

(2)

In equation (2) m is a number between and including 2 and 6, E is silicon and or germanium, $R^1$, $R^2$, and $R^3$ are the same or different and are hydrocarbon groups or hydrocarbon groups comprising one or more heteroatoms, such as a halogen, O, N, S, P, Si, and or Ge, M is an electropositive metal selected from groups 2-7 of the periodic table of the elements and or Al, and p is 1 or 2 and when p is 2 or 3 the electropositive metals that comprise the molecule $M_p$-$(ER^1R^2R^3)_m$ can be the same or different. Hydrocarbons include, for example, branched and un branched alkyl, aryl, cycloalkyl, alkenes, alkynes, cyclic, and polycyclic groups. In an embodiment of the invention $M_p$ is one or more metals, such as, Zr, Be, Mg, Ca, Sr, Al, Sc, Y, Ti, Hf, V, Nb, Ta, Cr, Mo, W, and Mn. Hydrogen in any of its common forms can be used in film deposition, for example, molecular hydrogen with or without plasma activation, and with or without the presence of additional inert gases, such as, as nitrogen, helium, neon, argon, krypton, or xenon. Reactive metal hydride bonds are formed on the substrate surface. Under the thermal, conditions of the ALD process, metal hydrides decompose to molecular hydrogen and metal. The reaction products are purged from the surface leaving an ultrathin metal layer.

Any remaining gaseous co-reactant and gaseous reaction products are then removed from the chamber, by, for example, purging the chamber with an inert gas such as, argon or nitrogen. The elements of exposing the substrate surface to a first reactant, removing any remaining gaseous reactant that is not adhered to the substrate surface, exposing the substrate to a co-reactant, and removing any gaseous co-reactant (and gaseous reaction products) from the chamber are repeated a plurality of times. These elements are repeated a number of times that is determined by the desired thickness of the resulting layer of electropositive metal(s) on the surface of the substrate. The elements could also be performed just one time.

In alternate embodiments of FIGS. 1A and 1B, a technique more similar to CVD is performed and the gaseous reactant(s) and co-reactant(s), if any, are provided together at the same time to substrate surface to form a layer of electropositive metals. In further alternate embodiments, the remaining gaseous reactant(s) and co-reactant(s) and gaseous products are removed from the chamber, the process of supplying gaseous reactant(s) and co-reactant(s) to the substrate surface is repeated a number of times to create a layer having a desired thickness.

In embodiments of the invention, the film comprising electropositive metal(s) has the electropositive metal(s) in the metallic (zero oxidation state) prior to exposure to any potential oxidants, such as for example, exposure to air. If the film is protected from oxidizing agents, the electropositive metal(s) remain in the zero oxidation state.

Figure 2A:
FIGS. 2A-F illustrate some precursor molecules that are useful in embodiments of the invention.
Figure 2B:
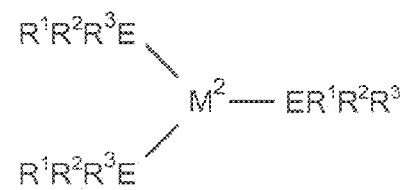
Figure 2C:
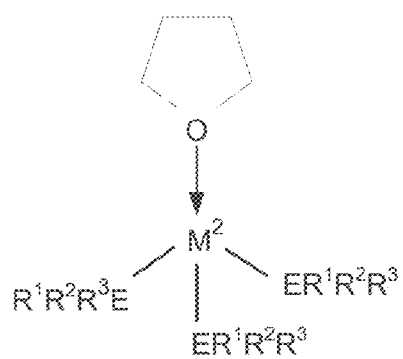
Figure 2D:
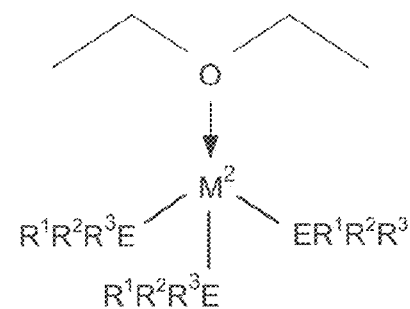
Figure 2E:
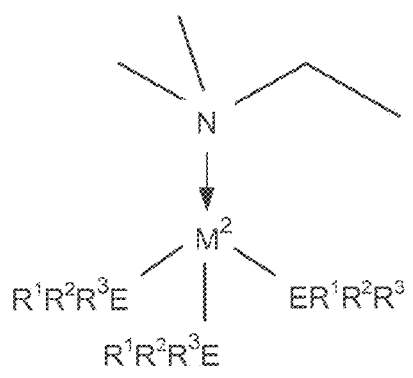
Figure 2F:
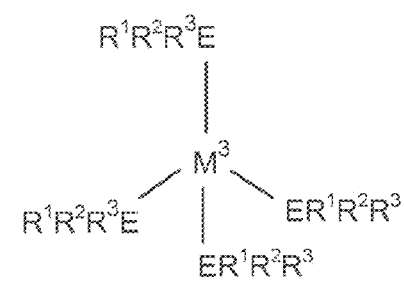
Figure 3A:
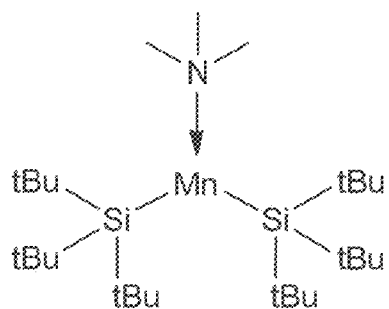
Figure 3B:
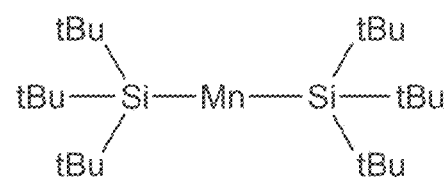
Figure 3C:
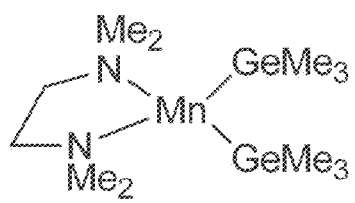
Figure 3D:
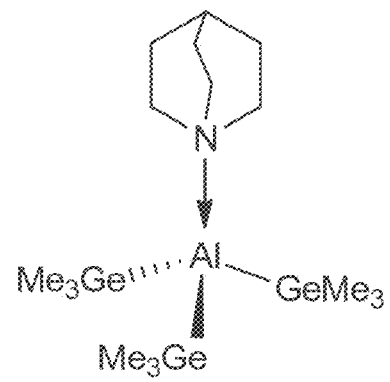
Figure 3E:
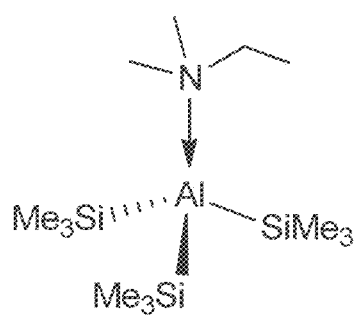
Figure 3F:
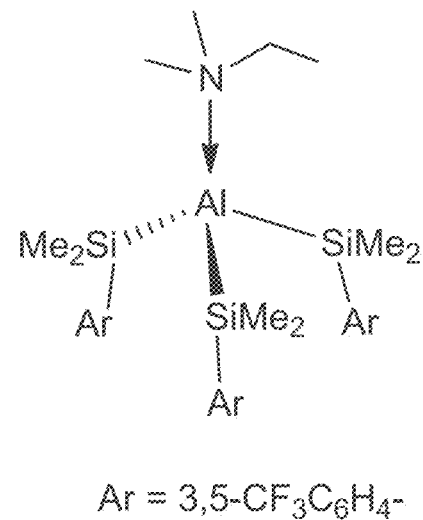
Figure 3G:
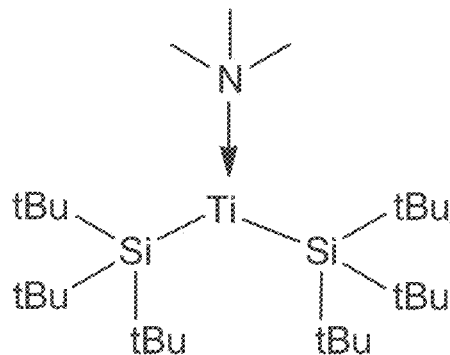

FIGS. 2A-F show precursor molecules useful in embodiments of the invention. Other precursor molecules comprising electropositive metals, 1-2 metal atoms, direct metal-silicon and or metal-germanium bonds, and other functional groups bonded to the Si and or Ge are also possible. In FIGS. 2A-F, within the functional group $-ER^1R^2R^3$, $R^1$, $R^2$, and $R^3$ are the same or different and are an alkyl, aryl, a group comprising a direct bond between E and a main group element such as Si, Ge, N, P, O or S or a heterocyclic group, and E is Si or Ge. In FIG. 2A, $M^1$ is an electropositive metal, such as, for example, Be, Mg, or Ca. In FIGS. 2B-E, $M^2$ is an electropositive metal, such as, for example, Ti, Sc, or Y, E is silicon or germanium. In FIG. 2F, $M^3$ is an electropositive metal, such as, for example, Ti, Zr, or Hf, E is silicon or germanium. In an embodiment of the invention, R is a methyl group. In a further embodiment of the invention, $-ER^1R^2R^3$ comprises two methyl groups and a benzyl group as R functionalities. In a further embodiment of the invention, a precursor molecule is $((CH_3)_3Si)_3Al:N(CH_3)_2(CH_2CH_3)$, $((CH_3)_2ArSi)_3Al:N(CH_3)_2(CH_2CH_3)$, $((CH_3)_3Si)_3Al(quinuclidine)$, $((CH_3)_3Ge)_3Al(quinuclidine)$, $((C_4H_9)_3Si)_2Mn$, $((C_4H_9)_3Si)_2Mn.N(CH_3)_3$, $((CH_3)_3Ge)_2Mn(tmeda)$ and $((C_4H_9)_3Si)_2TiN(CH_3)_3$, where Ar is an aromatic or hydrocarbon group optionally comprising one or more heteroatoms, and tmeda is tetramethylethylenediamine.

Processes according to embodiments of the invention can be used to create ultrathin metal layers used in, for example, gate electrode and source/drain contact applications in planar, trigate, and stacked nanowire transistor devices and interconnects (vias and wires) as barriers, seed layers, liners, caps, and or as conformal layers of the primary conducting interconnect metal. Methods according to embodiments of the invention are useful, for example, to deposit NMOS work function metals, NMOS metal diffusion barriers, PMOS work function metals, and or adhesion/liner layers. Metal layers according to embodiments of the invention have low levels of Si and or Ge present as a result of the use of the precursors that comprise direct metal-silicon and or metal-germanium bonds used to form the films. Levels of Si and or Ge present in films according to embodiments of the invention, range between 0.5 and 10.0 atomic %. In additional embodiments, levels of Si and or Ge present in the films range between 2 and 15 atomic %, or 2 and 8 atomic %.

In additional embodiments of the invention, metal layers comprising electropositive metals are created having higher levels of Si and or Ge in the layer. Typically, CVD processes are used to create metal silicide and or metal germanide films having a higher Si and or Ge content. For example, TiSi is a conductive material used in semiconductor fabrication that is created according to embodiments of the invention. Levels of Si and or Ge present in electropositive metal films according to additional embodiments of the invention, range between 10.0 to 67 atomic %.

FIGS. 3A-I show additional precursor molecules useful in embodiments of the invention. Other precursor molecules comprising different combinations group 2-7 metals and or Al, comprising 1 to 2 metal atoms, and different functional groups attached to the Si and or Ge are possible.

Figure 4:
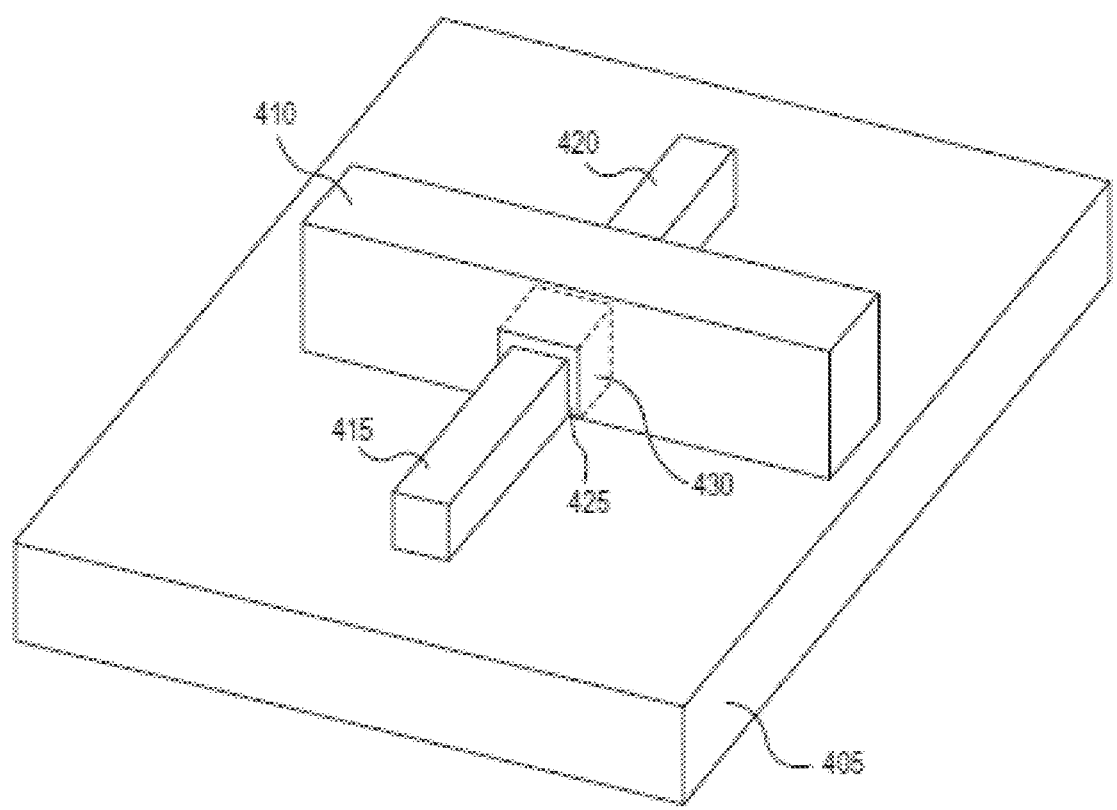
FIG. 4 is a schematic diagram illustrating a trigate transistor device.

FIG. 4 provides a simplified trigate transistor structure. In FIG. 4, an insulating substrate 405 comprises a gate electrode 410 and a source 415 and a drain 420 region. The insulating substrate 405 is comprised of, for example, a semiconductor substrate having a layer of insulating material, such as, $SiO_2$, formed thereon. A channel region 430 has a gate dielectric region 425 and gate electrode region 410 on three sides. The gate electrode region 410 is comprised of metal layers according to embodiments of the invention. The electrode region 410 is formed at least in part, for example, using the methods described herein that allow the deposition of thin conformal layers. These metal layers have low levels of Si or Ge present, levels which range between 0.5 and 10.0 atomic % Si or Ge (or between 2 and 15 atomic %, or 2 and 8 atomic %) and 99.5-75.0 atomic % of one or more group 2-7 metals or Al (or 98-70 atomic %, or 98-72 atomic %) that were present in the precursor molecules. After the conformal layers have been deposited, the electrode region can optionally be filled with conducting material using a different deposition process, such as, for example, an ALD or CVD process that employs different precursors. Optionally, an adhesion and or barrier layer (not shown) is between the gate dielectric region 425 and the gate electrode region 410. The source 415 and the drain 420 regions are formed, for example, of conducting P- or N-type semiconductor materials. Gate dielectric layer 425 is an insulating material, such as, for example, silicon dioxide ($SiO_2$), silicon oxynitride ($SiO_xN_y$), silicon nitride ($Si_3N_4$). The gate dielectric layer 425 can also be a high-k gate dielectric material, such as, for example, a metal oxide dielectric. The channel region 430 can be comprised of, for example, doped or undoped silicon, single crystal silicon, a mixture of silicon and germanium, or a III-V compound semiconductor (a compound comprising elements from groups III and V (or 13 and 15) of the periodic table), such as, for example, indium gallium arsenide (InGaAs), indium phosphide (InP), and indium aluminum arsenide (InAlAs). In general, a trigate transistor structure has a channel region surrounded on three sides by a gate dielectric and a gate electrode. Other configurations and shapes for the features pictured are also possible for trigate transistors, such as, for example, ones having differently shaped source and drain regions. Additionally, transistors have other associated features that for simplicity are not pictured. For example, the gate electrode region is typically partially defined by insulating spacers, the transistor structure can be covered in an insulating material and conducting vias connect the source and drain regions to other devices and regions of the semiconductor chip that houses the transistor. In further embodiments of the invention, the conducting vias (not shown) have a metal layer lining the inside of the contact which has low levels of Si or Ge present, levels which range between 0.5 and 10.0 atomic % Si or Ge (or between 2 and 15 atomic %, or 2 and 8 atomic %). In further embodiments of the invention, films comprise low levels of Si or Ge, levels which range between 0.5 and 10.0 atomic % Si or Ge (or between 2 and 15 atomic %, or 2 and 8 atomic %) and 99.5-75.0 atomic % of one or more group 2-7 metals and or Al (or 98-70 atomic %, or 98-72 atomic %) that were present in the precursor molecules. In additional embodiments of the invention, films comprise low levels of Si or Ge, levels which range between 0.5 and 10.0 atomic % Si or Ge (or between 2 and 15 atomic %, or 2 and 8 atomic %) and 99.5-75.0 atomic % of one or more group 2-7 metals and or Al (or 98-70 atomic %, or 98-72 atomic %) that were present in the precursor molecules, and a total amount of carbon, nitrogen, and oxygen impurities of less than 15 atomic percent. In additional embodiments of the invention, the layer lining the inside of the contact is formed according to methods described herein. This layer may be deposited on top of a thin diffusion barrier layer between the source/drain area and the contact metal.

Figure 5A:
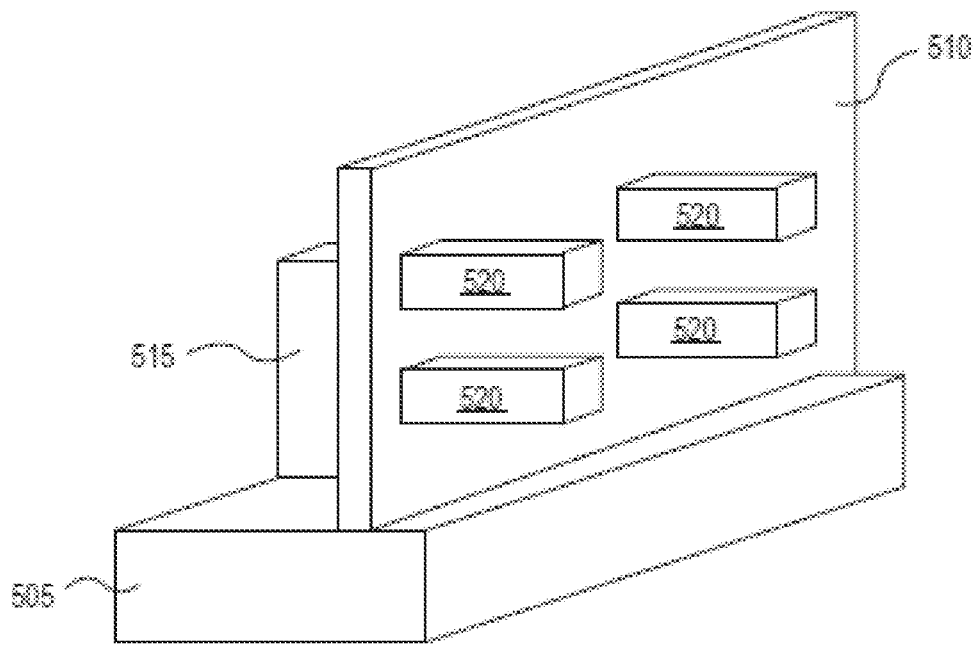
FIGS. 5A-C are schematic diagrams illustrating a stacked nanowire transistor device.
Figure 5B:
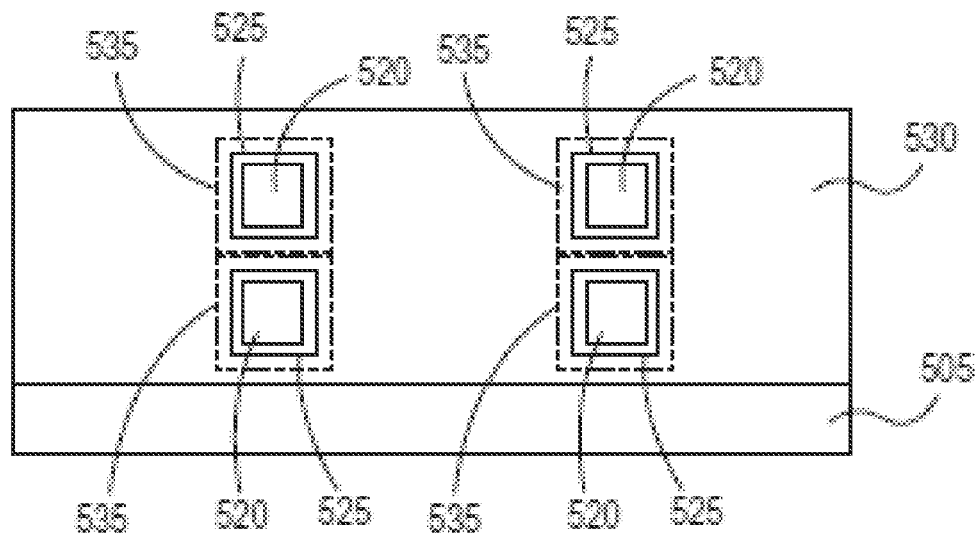
Figure 5C:
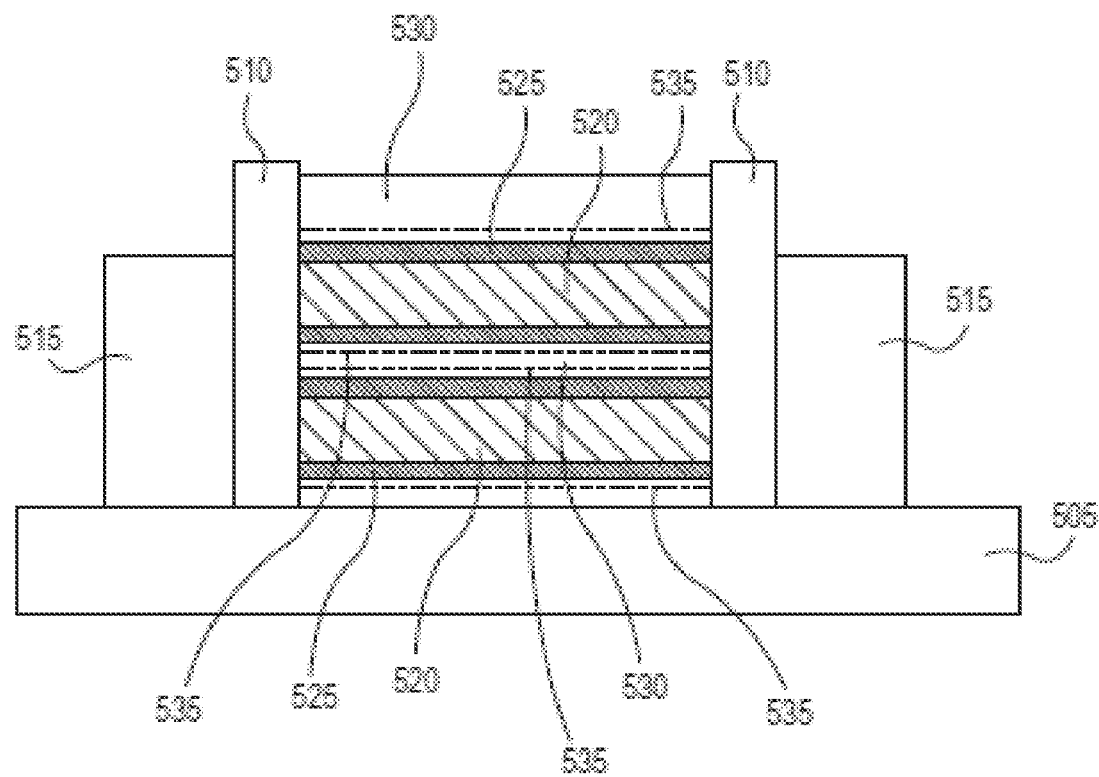

FIGS. 5A-C illustrate a stacked nanowire transistor device. The diagram of FIG. 5A shows half a stacked nanowire transistor device to facilitate explanation. FIG. 5B represents the device of FIG. 5A in a perspective view that has been rotated 45° relative to the view in FIG. 5A and a gate dielectric layer and gate metal have now been included in FIG. 5B. FIG. 5C shows the stacked nanowire transistor device sliced along a plane that is rotated 90° relative to the plane of the slice of FIG. 5A and the device itself has been rotated −45°. In FIG. 5A, a substrate 505 houses an insulating spacer 510 and a source/drain region 515. Nanowire channel regions 520, illustrated as two per transistor are in contact with the source/drain regions 515. Nanowire channel regions 520 comprise, for example, silicon, silicon and germanium, or a III-V compound semiconductor, for example, indium gallium arsenide (InGaAs), indium phosphide (InP), and indium aluminum arsenide (InAlAs). In FIGS. 5B-C, a gate dielectric 525 is disposed on channel region 520 and a gate electrode region 530 is disposed on the gate dielectric 525. The gate dielectric 525 is an insulating material, such as, silicon dioxide ($SiO_2$), silicon oxynitride ($SiO_xN_y$), silicon nitride ($Si_3N_4$), or a high-k dielectric material. Processes as described herein can be used to deposit a thin conformal layer of metal 535 around the gate dielectric 525. The thin conformal metal layers 535 have low levels of Si or Ge present, levels which range between 0.5 and 10.0 atomic % Si or Ge (or between 2 and 15 atomic %, or 2 and 8 atomic %). In further embodiments of the invention, films comprise low levels of Si or Ge, levels which range between 0.5 and 10.0 atomic % Si or Ge (or between 2 and 15 atomic %, or 2 and 8 atomic %) and 99.5-75.0 atomic % of one or more group 2-7 metals and or Al (or 98-70 atomic %, or 98-77 atomic %) that were present in the precursor molecules. In additional embodiments of the invention, films comprise low levels of Si or Ge, levels which range between 0.5 and 10.0 atomic % Si or Ge (or between 2 and 15 atomic %, or 2 and 8 atomic %) and 99.5-75.0 atomic % of one or more group 2-7 metals and or Al (or 98-70 atomic %, or 98-72 atomic %) that were present in the precursor molecules, and a total amount of carbon, nitrogen, and oxygen impurities of less than 15 atomic percent. The remaining gate electrode region 530 can comprise the same metal or a different conducting substance as the thin conformal metal layer 535 and can be deposited by the same or a different method. In additional embodiments, the gate electrode region 530 can comprise, for example, materials such as Ti, W, Ta, Al, and alloys thereof, and alloys with rare earth elements, such as Er, Dy or noble metals such as Pt, and nitrides such as TaN, and TiN. Optionally, an adhesion and or barrier layer (not shown) is between the gate dielectric region 525 and the gate electrode region 530. Other configurations and shapes for the features depicted are also possible for stacked nanowire transistors, such as, for example, ones having different numbers of nanowire transistors (such as, one, two, or three or more nanowires) and differently shaped source and drain regions.

In general, a high-k dielectric is a dielectric material having a dielectric constant greater than that of $SiO_2$. The dielectric constant of $SiO_2$ is 3.9. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, lead zinc niobate, and other materials known in the semiconductor art.

Figure 6:
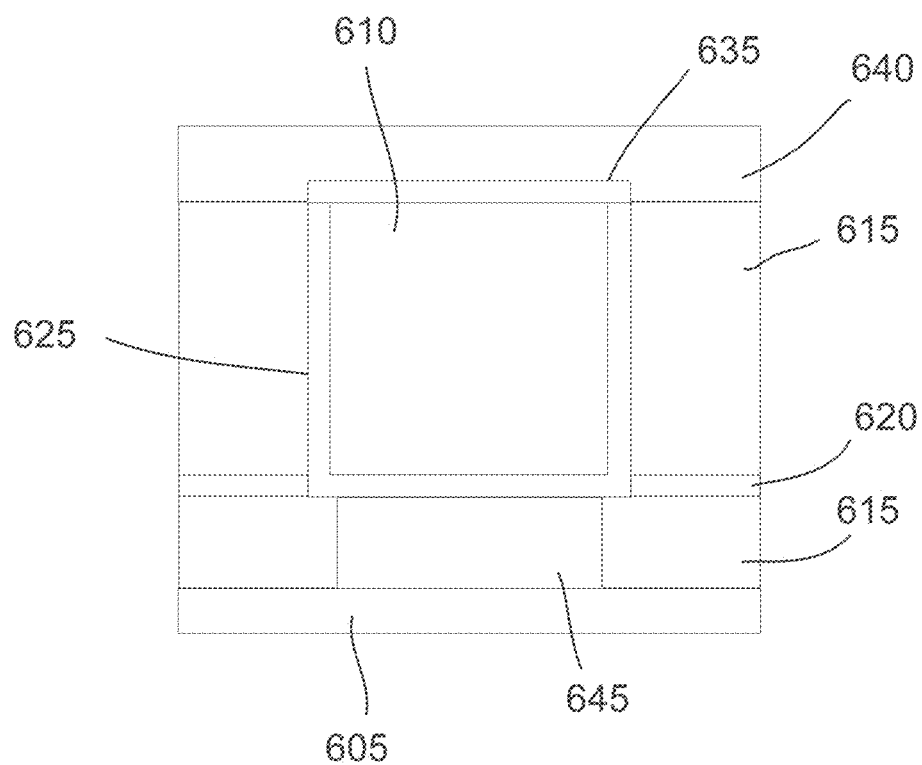
FIG. 6 illustrates a metal interconnect structure.

In additional embodiments of the invention, processes according to embodiments of the invention are used to deposit metal for BEOL (back end of the line) interconnect applications. These applications include adhesion layers, liners, barriers, caps for electromigration reduction, and the interconnect metal itself. FIG. 6 illustrates a metal interconnect structure, such as a trench or via. In FIG. 6, a substrate 605 houses metal trench or via 610. The metal trench or via 610 is within insulating layer 615, which is, for example an interlayer dielectric (ILD). Dielectric materials include low-k dielectrics and silicon dioxide. Optional layer 620, is an etch-stop layer comprised of a dielectric material, such as, silicon nitride, silicon oxynitride, and silicon dioxide. A barrier layer 625 separates metal trench or via 610 from the dielectric layers 615 and 620. The structure optionally also includes a capping layer 635 that separates metal trench or via 610 from an additional dielectric layer 640 (such as an ILD) deposited on top of metal trench or via 610. The metal trench or via 610 optionally is electrically connected to underlying second metal trench or via 645. Metal trenches or vias 610 and 645 are comprised of, for example, copper, aluminum, silver, and alloys thereof. Further optionally, the structure of FIG. 6 comprises the capping layer 635, but a different barrier layer 625 or no barrier layer 625. In an embodiment of the invention, metal trenches or vias 610 and 640 are comprised of copper. In embodiments of the invention, barrier layers 625 can comprise W, Hf, and or Ta, and metal caps 635 for electromigration reduction can comprise W. A thin conformal layer of W, Hf, and or Ta is deposited according to embodiments of the invention on top of an interlayer dielectric (ILD) (comprised of, for example, a dielectric material such as a low-k material or $SiO_2$) and then coated with an ALD Cu film prior to electroplating. Capping layers can be selectively deposited on exposed metal surfaces with respect to dielectric surfaces. Atomic layer deposition on dielectric surfaces can be inhibited through their surface functionalization with thin organic films including, but not limited to, self-assembled monolayers and amino(organo)silanes. As discussed previously, electropositive metal films according to embodiments of the invention, that are unmodified after deposition, have low levels of Si or Ge present, levels which range between 0.5 and 10.0 atomic % Si or Ge (or between 2 and 15 atomic %, or 2 and 8 atomic %). In further embodiments of the invention, films comprise low levels of Si or Ge, levels which range between 0.5 and 10.0 atomic % Si or Ge (or between 2 and 15 atomic %, or 2 and 8 atomic %) and 99.5-75.0 atomic % (or 98-70 atomic %, or 98-72 atomic %) of one or more group 2-7 metal and or Al (e.g., W, Hf, and or Ta) that were present in the precursor molecules. In additional, embodiments of the invention, films comprise low levels of Si or Ge, levels which range between 0.5 and 10.0 atomic % Si or Ge (or between 2 and 15 atomic %, or 2 and 8 atomic %) and 99.5-75.0 atomic % (or 98-70 atomic %, or 98-72 atomic %) of one or more group 2-7 metals and or Al that were present in the precursor molecules, and a total amount of carbon, nitrogen, and oxygen impurities of less than 15 atomic percent.

Typical dielectric materials used for dielectric layers, features, and or interlayer dielectrics (ILD) include silicon dioxide and low-k dielectric materials. Additional dielectric materials that may be used include, carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer may include pores to further reduce the dielectric constant.

Components of devices shown herein may comprise additional layers, such as liner and adhesion layers that separate layers comprising different materials, such as, for example, metal layers from insulating layers, and components illustrated as one layer for simplicity, can comprise a plurality of layers of the same or a different material depending, for example, on the manufacturing processes employed in constructing the device and the desired properties of the device.

Implementations of the invention are housed on a substrate, such as a semiconductor substrate. Substrate surfaces on which electropositive metal layers according to embodiments of the invention can be formed include, for example, H-terminated silicon, silicon dioxide, silicon, silicon germanium, a group III-V (or a group 13-14 in additional periodic table column numbering schemes) compound semiconductor, a main-group oxide, a metal, and or a binary or mixed metal oxide. Layers and layers comprising devices can also be described as the substrate or part of the substrate on which embodiments of the invention are fabricated. The substrate base on which semiconductor devices are built is typically a semiconductor wafer that is diced apart to yield individual IC chips. The base substrate on which a chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and or other group III-V materials either alone or in combination with silicon or silicon dioxide or other insulating materials.

Figure 7:
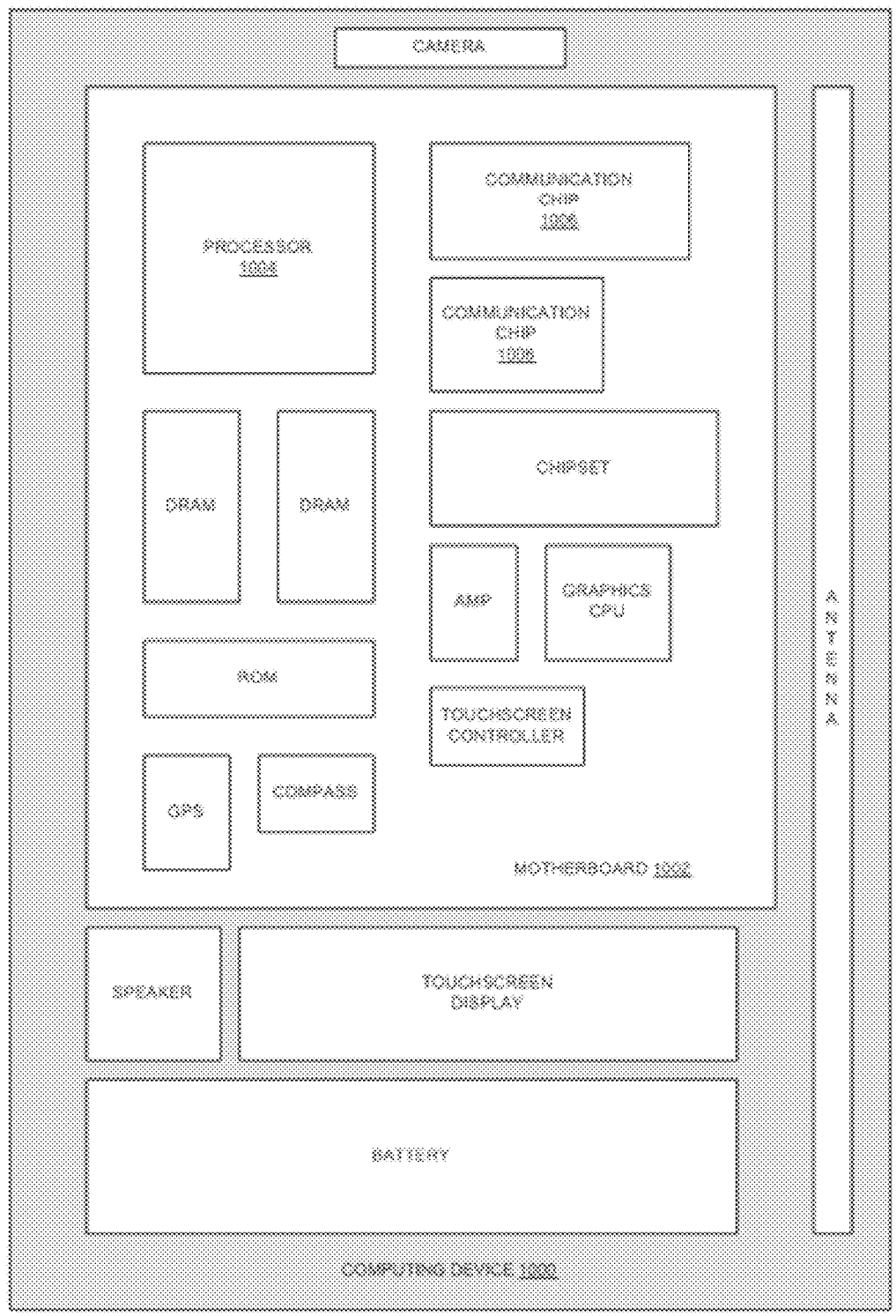
FIG. 7 is a computing device built in accordance with an implementation of the invention.

FIG. 7 illustrates a computing device 1000 in accordance with one implementation of the invention. The computing device 1000 houses a motherboard 1002. The motherboard 1002 may include a number of components, including but not limited to a processor 1004 and at least one communication chip 1006. The processor 1004 is physically and electrically coupled to the motherboard 1002. In some implementations the at least one communication chip 1006 is also physically and electrically coupled to the motherboard 1002.

Depending on its applications, computing device 1000 may include other components that may or may not be physically and electrically coupled to the motherboard 1002. These other components include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as transistors and or metal interconnects, that are formed in accordance with implementations of the invention. The term "processor" may refer to any device or portion of a device that, processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as transistors and or metal interconnects, that are formed in accordance with implementations of the invention.

In further implementations, another component housed within the computing device 1000 may contain an integrated circuit die that includes one or more devices, such as transistors or metal interconnects, that are formed in accordance with implementations of the invention.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

In the previous description, numerous specific details are set forth, such as layouts for transistors, interconnects, and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics disclosed in the embodiments may be combined in any suitable manner in one or more embodiments. Various additional, layers and/or structures may be included and/or described features may be omitted in other embodiments.

We claim:

1. A nanowire transistor device comprising, a nanowire that forms a channel region of the transistor device, a layer of dielectric material disposed on the nanowire, a metal layer disposed on the layer of dielectric material wherein the metal layer comprises 99.5-75.0 atomic % of a group 2-7 metal or Al and Si or Ge present in an amount that ranges between 0.5 and 10.0 atomic % of Si or Ge, wherein the metal layer forms at least part of the gate electrode and the nanowire extends between a source and a drain region of the transistor device.

2. The device of claim 1 wherein the metal layer comprises a total amount of carbon, nitrogen, and oxygen of less than 15 atomic %.

3. The device of claim 1 wherein the layer of dielectric material is comprised of silicon dioxide ($SiO_2$), silicon oxynitride ($SiO_xN_y$), silicon nitride ($Si_3N_4$), or a high-k dielectric material.

4. The device of claim 1 wherein the nanowire is comprised of silicon, a mixture of silicon and germanium, or a III-V compound semiconductor.

5. The device of claim 1 wherein the device comprises two nanowires.

6. A device comprising,
a layer of dielectric material,
a trench or a via formed in the layer of dielectric material, the trench or via having sidewalls and a bottom surface,
a barrier layer disposed on the sidewalls and bottom surface, wherein the barrier layer comprises 99.5-75.0 atomic % of a group 2-7 metal and Si or Ge present in an amount that ranges between 0.5 and 10.0 atomic % of Si or Ge, and
a metal region within the well wherein the barrier layer is between the metal region and the layer of dielectric material.

7. The device of claim 6 wherein the group 2-7 metal is W, Hf, Ta or combinations thereof.

8. The device of claim 6 wherein the metal layer comprises a total amount of carbon, nitrogen, and oxygen of less than 15 atomic %.

9. The device of claim 6 wherein the metal region is comprised of silver, copper, or aluminum.

10. A device comprising,
a layer of dielectric material,
a trench or a via formed in the layer of dielectric material,
a metal region within the trench or via, wherein the metal region has a surface, and
a capping layer disposed on the surface of the metal region, wherein the capping layer comprises 99.5-75.0 atomic % of a group 2-7 metal and Si or Ge present in an amount that ranges between 0.5 and 10.0 atomic % of Si or Ge.

11. The device of claim 10 wherein the group 2-7 metal is W.

12. The device of claim 10 wherein the metal layer comprises a total amount of carbon, nitrogen, and oxygen of less than 15 atomic %.

13. The device of claim 10 wherein the metal region is comprised of silver, copper, or aluminum.

14. A computing device comprising:
a motherboard;
a communication chip mounted on the motherboard; and
a processor mounted on the motherboard, the processor comprising:
nanowire transistor device comprising, a nanowire that forms a channel region of the transistor device, a layer of dielectric material disposed on the nanowire, a metal layer disposed on the layer of dielectric material wherein the metal layer comprises 99.5-75.0 atomic % of a group 2-7 metal or Al and Si or Ge present in an amount that ranges between 0.5 and 10.0 atomic % of Si or Ge, wherein the metal layer forms at least part of the gate electrode and the nanowire extends between a source and a drain region of the transistor device.

15. A computing device comprising:
a motherboard;
a communication chip mounted on the motherboard; and
a processor mounted on the motherboard, the processor comprising:
a layer of dielectric material,
a trench or a via formed in the layer of dielectric material, the trench or via having sidewalls and a bottom surface,
a barrier layer disposed on the sidewalls and bottom surface, wherein the barrier layer comprises 99.5-75.0 atomic % of a group 2-7 metal and Si or Ge present in an amount that ranges between 0.5 and 10.0 atomic % of Si or Ge, and
a metal region within the well wherein the barrier layer is between the metal region and the layer of dielectric material.

16. The computing device of claim 14 wherein the metal layer comprises a total amount of carbon, nitrogen, and oxygen of less than 15 atomic %.

17. The computing device of claim 14 wherein the layer of dielectric material is comprised of silicon dioxide ($SiO_2$), silicon oxynitride ($SiO_xN_y$), silicon nitride ($Si_3N_4$), or a high-k dielectric material.

18. The computing device of claim 14 wherein the nanowire is comprised of silicon, a mixture of silicon and germanium, or a III-V compound semiconductor.

19. The computing device of claim 14 wherein the device comprises two nanowires.

20. The computing device of claim 15 wherein the group 2-7 metal is W, Hf, Ta or combinations thereof.

21. The device of claim 15 wherein the metal layer comprises a total amount of carbon, nitrogen, and oxygen of less than 15 atomic %.

22. The device of claim 15 wherein the metal region is comprised of silver, copper, or aluminum.

23. A computing device comprising:
a motherboard;
a communication chip mounted on the motherboard; and
a processor mounted on the motherboard, the processor comprising:
a layer of dielectric material,
a trench or a via formed in the layer of dielectric material,
a metal region within the trench or via, wherein the metal region has a surface, and
a capping layer disposed on the surface of the metal region, wherein the capping layer comprises 99.5-75.0 atomic % of a group 2-7 metal and Si or Ge present in an amount that ranges between 0.5 and 10.0 atomic % of Si or Ge.

24. The computing device of claim 23 wherein the group 2-7 metal is W.

25. The computing device of claim 23 wherein the metal layer comprises a total amount of carbon, nitrogen, and oxygen of less than 15 atomic %.

26. The computing device of claim 23 wherein the metal region is comprised of silver, copper, or aluminum.

* * * * *